US012697719B2

(12) United States Patent
Cox et al.

(10) Patent No.: US 12,697,719 B2
(45) Date of Patent: Aug. 4, 2026

(54) PROCESS KIT ALIGNMENT METHOD FOR IMPROVING SEMICONDUCTOR YIELD

(71) Applicant: Applied Materials, Inc., Santa Clara, CA (US)

(72) Inventors: Damon K. Cox, Jarrell, TX (US); Ali Utku Pehlivan, Austin, TX (US); Paul Benjamin Reuter, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 519 days.

(21) Appl. No.: 18/244,495

(22) Filed: Sep. 11, 2023

(65) Prior Publication Data

US 2025/0083308 A1      Mar. 13, 2025

(51) Int. Cl.
| | |
|---|---|
| *B25J 9/16* | (2006.01) |
| *H01L 21/683* | (2006.01) |
| *H10P 72/50* | (2026.01) |
| *H10P 72/72* | (2026.01) |

(52) U.S. Cl.
CPC .............. *B25J 9/163* (2013.01); *H10P 72/50* (2026.01); *H10P 72/722* (2026.01)

(58) Field of Classification Search
CPC .. B25J 9/163; H01L 21/6833; H10P 72/0606; H10P 72/50; H10P 72/722
See application file for complete search history.

(56) References Cited

U.S. PATENT DOCUMENTS

| | | | |
|---|---|---|---|
| 8,768,513 B2 | 7/2014 | Cox et al. | |
| 12,555,753 B2 * | 2/2026 | Kitamura | .......... H01J 37/32642 |
| 2019/0348317 A1 * | 11/2019 | D'Ambra | .............. G01N 21/64 |
| 2020/0312635 A1 * | 10/2020 | Kim | .................. H01J 37/32642 |
| 2021/0378119 A1 * | 12/2021 | Criminale | .............. H05K 5/069 |
| 2022/0165550 A1 * | 5/2022 | Kim | .................. H01J 37/32642 |
| 2022/0243336 A1 * | 8/2022 | Amikura | ................. C23C 16/54 |
| 2022/0406635 A1 * | 12/2022 | Myles | ................. H10P 72/0606 |
| 2025/0006533 A1 * | 1/2025 | Matsumoto | ......... H10P 72/3302 |
| 2025/0232965 A1 * | 7/2025 | Okamura | .......... H01J 37/32715 |
| 2025/0308859 A1 * | 10/2025 | Celeste | ............ H01J 37/32642 |

* cited by examiner

*Primary Examiner* — Mark A Connolly
(74) *Attorney, Agent, or Firm* — Lowenstein Sandler LLP

(57) ABSTRACT

A method includes causing an upper process kit ring to be removed from a lower process kit ring. The method further includes, responsive to causing the upper process kit ring to be removed from the lower process kit ring, causing, based on sensor data, a first position correction associated with the lower process kit ring. The method further includes, responsive to the first position correction, causing the upper process kit ring to be disposed on the lower process kit ring.

20 Claims, 9 Drawing Sheets

100

700A

Start

Initialize data set T to { } ⟋ 702

Generate data input including historical sensor data ⟋ 704

Generate target output including historical performance data for the training input ⟋ 706

Generate an input/output mapping ⟋ 708

Add input/output mapping to data set T ⟋ 710

Is set T sufficient? ⟋ 712

No

Yes

Provide data set T to train, validate, or test a machine learning model ⟋ 714

End

PROCESS KIT ALIGNMENT METHOD FOR IMPROVING SEMICONDUCTOR YIELD

TECHNICAL FIELD

The present disclosure relates to position correction, and, more particularly, position correction of process kit rings.

BACKGROUND

Manufacturing equipment are used to produce products. For example, substrate processing equipment are used to produce substrates.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes causing an upper process kit ring to be removed from a lower process kit ring. The method further includes, responsive to the causing of the upper process kit ring to be removed from the lower process kit ring, causing, based on sensor data, a first position correction associated with the lower process kit ring. The method further includes, responsive to the first position correction, causing the upper process kit ring to be disposed on the lower process kit ring.

In another aspect of the disclosure, a non-transitory computer-readable storage medium storing instructions which, when executed, cause a processing device to perform operations. The operations include causing an upper process kit ring to be removed from a lower process kit ring. The operations further include, responsive to the causing of the upper process kit ring to be removed from the lower process kit ring, causing, based on sensor data a first position correction associated with the lower process kit ring. The operations further include, responsive to the first position correction, causing the upper process kit ring to be disposed on the lower process kit ring.

In another aspect of the disclosure, a system includes a memory and a processing device coupled to the memory. The processing device is to cause an upper process kit ring to be removed from a lower process kit ring. The processing device is further to, responsive to causing the upper process kit ring to be removed from the lower process kit ring, cause, based on sensor data, a first position correction associated with the lower process kit ring. The processing device is further to, responsive to the first position correction cause the upper process kit ring to be disposed on the lower process kit ring.

BRIEF DESCRIPTION OF THE DRAWINGS

The present disclosure is illustrated by way of example, and not by way of limitation in the figures of the accompanying drawings.

DETAILED DESCRIPTION

Figure 1:
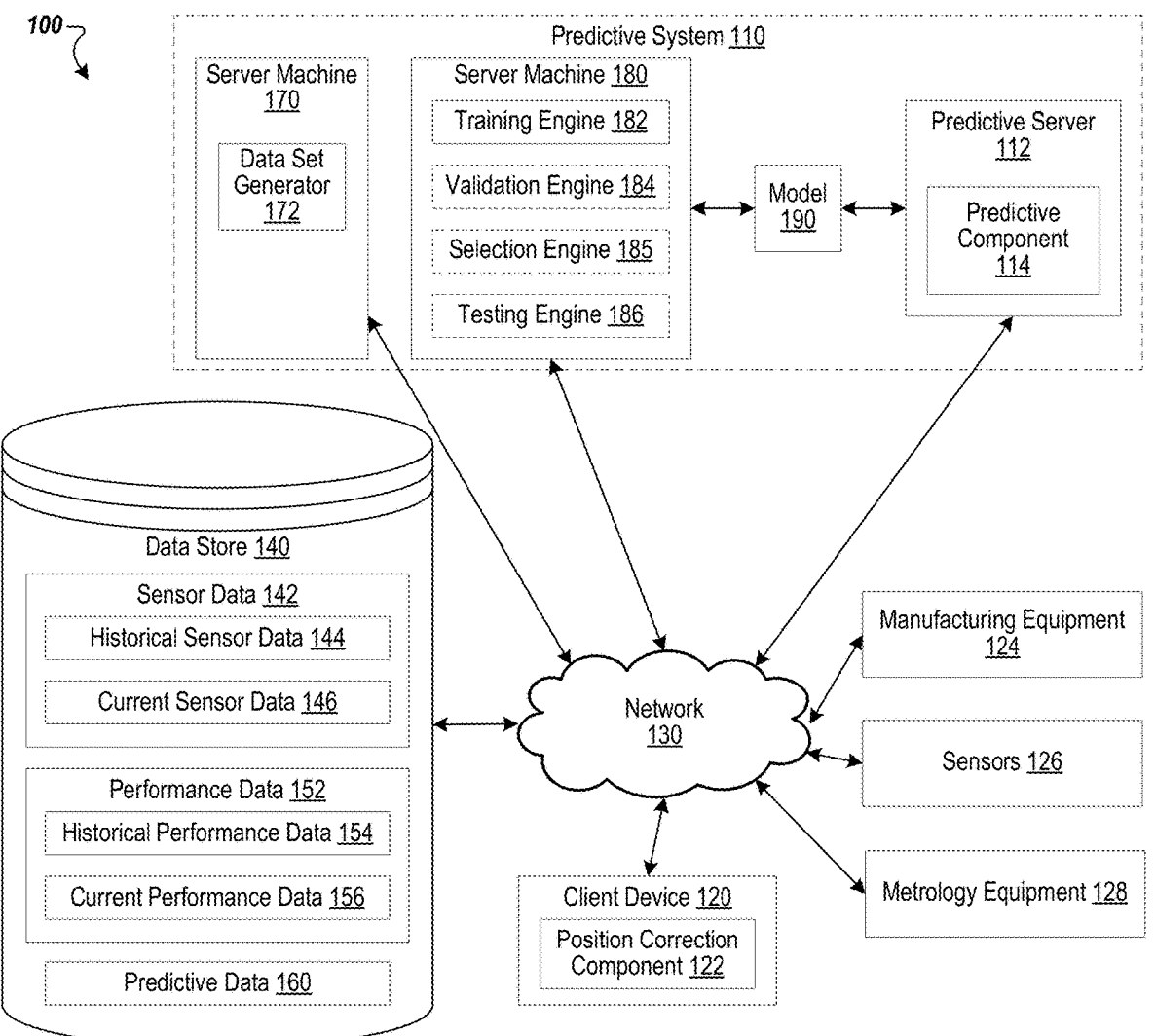
FIG. 1 is a block diagram illustrating an exemplary system architecture, according to certain embodiments.

Described herein are technologies directed to position correction of process kit rings, according to certain embodiments (e.g., process kit ring alignment, correcting concentricity of chamber process kit rings, process kit alignment method for improving semiconductor yield).

Manufacturing equipment include different parts that are used to produce products. For example, substrate processing equipment includes parts that are used to produce substrates (e.g., process substrates). Some parts, such as process kit rings are to be placed or replaced (e.g., after the old process kit ring wears down) in correct positions in the substrate processing system. The position of the parts affects the performance data of the products. For example, a process kit ring that is incorrectly placed in a processing chamber of the substrate processing system can cause substrates to be produced with performance data that does not meet threshold values (e.g., produce bad wafers).

In some conventional systems, the substrate processing system (e.g., processing chamber) is opened and the parts (e.g., process kit rings) are manually placed in the correct positions in the processing chamber. Responsive to opening of the substrate processing system (e.g., the processing chamber), the substrate processing system is to be re-commissioned which takes extended time and materials. This reduces yield of the substrate processing system.

In some conventional systems, a part may be placed in a processing chamber without opening of the processing chamber to the environment. The part may be placed in an incorrect position in the processing chamber. This may cause the substrates to be produced with performance data that does not meet threshold values (e.g., produce bad wafers). This may also cause parts to prematurely wear down and/or to be prematurely replaced. This may reduce yield, reduce substrate quality, cause equipment to prematurely wear down, and/or the like.

The devices, systems, and methods disclosed herein provide position correction of process kit rings (e.g., process kit ring alignment).

In some embodiments, a processing device cause a robot to extend into a processing chamber. The robot may be supporting an upper process kit ring disposed on a lower process kit ring (e.g., disposed on a carrier). The upper process kit ring may have a larger outside diameter than the lower process kit ring. The lower process kit ring may have a smaller inside diameter than the upper process kit ring. In some embodiments, the upper process kit ring disposed on the lower process kit ring may pass by one or more sensors (e.g., coupled to the processing chamber) that provides sensor data associated with an outside diameter of the upper process kit ring and an inside diameter of a lower process kit ring. The processing device may determine a center of the upper process kit ring based on the outside diameter and may determine a center of the lower process kit ring based on the inside diameter. The processing device may cause, based on the sensor data (e.g., the center of the upper process kit ring), position correction associated with the upper process kit ring (e.g., moving the stack of process kit rings in the x-direction and/or y-direction to align the upper process kit ring with a corresponding location in the processing chamber).

The processing device may cause the upper process kit ring to be removed from the lower process kit ring. In some embodiments, the processing device causes the stack of process kit rings (e.g., using a redundant degree of freedom of the robot) to be rotated without changing the position (e.g., center) of the stack of process kit rings and causes the pins of the processing chamber to lift the upper process kit ring to be removed. In some embodiments, the processing device causes the upper process kit ring to be disposed on a shelf.

Responsive to causing the upper process kit ring to be removed from the lower process kit ting, the processing device may cause, based on the sensor data (e.g., the center of the lower process kit ring), a position correction associated with the lower process kit ring (e.g., moving the lower process kit ring in the x-direction and/or y-direction to align the lower process kit ring with a corresponding location in the processing chamber and/or to align concentricity of the upper process kit ring and the lower process kit ring). Responsive to the position correction of the lower process kit ring, the processing device causes the upper process kit ring to be disposed on the lower process kit ring and causes the stack of process kit rings to be lowered into the processing chamber.

In some embodiments, the sensor data is provided as input to a trained machine learning model and output associated with position correction is received from the machine learning model.

Aspects of the present disclosure result in technological advantages. The present disclosure more correctly places process kit rings in processing chambers compared to conventional systems. This causes the present disclosure to produce substrates that have performance data that more closely meets threshold values (e.g., better wafers) compared to conventional systems. This also causes the present disclosure to wear down components less than conventional systems. This increases yield, increases substrate quality, and causes equipment to have less wear compared to conventional systems. The present disclosure correctly places process kit rings in processing chambers without the opening of the processing chambers of conventional systems. This reduces down time, reduces materials used, avoids re-commissioning processes, increases throughput, avoids interruption of production, etc.

Some embodiments of the present disclosure describe performing position correction of process kit rings without opening the process chamber which eliminates the extensive cleaning of the processing chamber after the processing chamber has been opened and the process kit rings replaced. This avoids releasing the vacuum conditions of the processing chamber and the reintroduction of the vacuum conditions after the process kit rings have been replaced.

FIG. 1 is a block diagram illustrating an exemplary system 100 (exemplary system architecture), according to certain embodiments. The system 100 includes a client device 120, manufacturing equipment 124, sensors 126, metrology equipment 128, a predictive server 112, and a data store 140. In some embodiments, the predictive server 112 is part of a predictive system 110. In some embodiments, the predictive system 110 further includes server machines 170 and 180.

In some embodiments, one or more of the client device 120, manufacturing equipment 124, sensors 126, metrology equipment 128, predictive server 112, data store 140, server machine 170, and/or server machine 180 are coupled to each other via a network 130 for generating predictive data 160 to perform position correction. In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/ or a combination thereof.

In some embodiments, the client device 120 includes a computing device such as Personal Computers (PCs), laptops, mobile phones, smart phones, tablet computers, netbook computers, etc. In some embodiments, the client device 120 includes a position correction component 122. In some embodiments, the position correction component 122 may also be included in the predictive system 110 (e.g., machine learning processing system). In some embodiments, the position correction component 122 is alternatively included in the predictive system 110 (e.g., instead of being included in client device 120). Client device 120 includes an operating system that allows users to one or more of consolidate, generate, view, or edit data, provide directives to the predictive system 110 (e.g., machine learning processing system), etc.

In some embodiments, position correction component 122 receives user input (e.g., via a Graphical User Interface (GUI) displayed via the client device 120), receives sensor data 142 from sensors, receives performance data 152 from metrology equipment 128, etc. In some embodiments, the position correction component 122 transmits the data (e.g., user input, sensor data 142, performance data 152, etc.) to the predictive system 110, receives predictive data 160 from the predictive system 110, determines a position correction based on the predictive data 160, and causes the position correction to be implemented. In some embodiments, the position correction component 122 stores data (e.g., user input, sensor data 142, performance data 152, etc.) in the data store 140 and the predictive server 112 retrieves data from the data store 140. In some embodiments, the predictive server 112 stores output (e.g., predictive data 160) of the trained machine learning model 190 in the data store 140 and the client device 120 retrieves the output from the data store 140. In some embodiments, the position correction component 122 receives an indication of a position correction (e.g., based on predictive data 160) from the predictive system 110 and causes performance of the position correction.

In some embodiments, the predictive data 160 is associated with a position correction of one or more process kit rings (e.g., to be aligned, to be concentric, etc.). In some embodiments, a position correction is associated with replacing a substrate processing equipment part, Computational Process Control (CPC), Statistical Process Control (SPC) (e.g., SPC to compare to a graph of 3-sigma, etc.), Advanced Process Control (APC), model-based process control, preventative operative maintenance, design optimization, updating of manufacturing parameters, feedback control, machine learning modification, or the like. In some embodiments, the position correction includes providing an alert (e.g., an alarm to not use the substrate processing equipment part or the manufacturing equipment 124 if the predictive data 160 indicates a predicted abnormality, such as an incorrect position of the substrate processing equipment part). In some embodiments, the position correction includes providing feedback control (e.g., realigning the substrate processing equipment part responsive to the predictive data 160 indicating a predicted incorrect position). In some embodiments, the position correction includes providing machine learning (e.g., causing position correction of a substrate processing equipment part based on the predictive data 160).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 receives sensor data 142 (e.g., receive from the client device 120, retrieve from the data store 140) and generates predictive data 160 associated with position correction. In some embodiments, the predictive component 114 uses one or more trained machine learning models 190 to determine the predictive data 160 for process kit alignment. In some embodiments, trained machine learning model 190 is trained using historical sensor data 144 and historical performance data 154.

In some embodiments, the predictive system 110 (e.g., predictive server 112, predictive component 114) generates predictive data 160 using supervised machine learning (e.g., supervised data set, historical sensor data 144 labeled with historical performance data 154, etc.). In some embodiments, the predictive system 110 generates predictive data 160 using semi-supervised learning (e.g., semi-supervised data set, performance data 152 is a predictive percentage, etc.). In some embodiments, the predictive system 110 generates predictive data 160 using unsupervised machine learning (e.g., unsupervised data set, clustering, clustering based on historical sensor data 144, etc.).

In some embodiments, the manufacturing equipment 124 (e.g., cluster tool) is part of a substrate processing system (e.g., integrated processing system). The manufacturing equipment 124 includes one or more of a controller, an enclosure system (e.g., substrate carrier, front opening unified pod (FOUP), auto teach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers (e.g., to house process kit rings), a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber. In some embodiments, the manufacturing equipment 124 includes components of substrate processing systems. In some embodiments, the sensor data 142 include parameters of processes performed by components of the manufacturing equipment 124 (e.g., etching, heating, cooling, transferring, processing, flowing, etc.). In some embodiments, substrate processing equipment parts are a component (e.g., showerhead, susceptor, electrostatic chuck, edge ring, process kit ring, etc.) of the processing chamber.

In some embodiments, the sensors 126 provide sensor data 142 (e.g., sensor values, such as historical sensor values and current sensor values) associated with manufacturing equipment 124. In some embodiments, the sensors 126 include one or more of an imaging sensor (e.g., camera, image capturing device, interferometer data etc.), a pressure sensor, a temperature sensor, a flow rate sensor, a spectroscopy sensor, and/or the like. In some embodiments, the sensor data 142 used to determine a location (e.g., center based on inside diameter or outside diameter) of a part (e.g., process kit ring).

In some embodiments, sensors 126 provide sensor data 142 such as values of one or more of image data, interferometer data, capacitance data.

In some embodiments, the sensor data 142 (e.g., historical sensor data 144, current sensor data 146, etc.) is processed by the client device 120 and/or by the predictive server 112. In some embodiments, processing of the sensor data 142 includes generating features. In some embodiments, the features are a portion of the sensor data 142 (e.g., interferometer data), image data, pattern in the sensor data 142 (e.g., slope, width, height, peak, etc.) or a combination of values from the sensor data 142. In some embodiments, the sensor data 142 includes features that are used by the predictive component 114 for obtaining predictive data 160.

In some embodiments, the metrology equipment 128 (e.g., imaging equipment, spectroscopy equipment, ellipsometry equipment, etc.) is used to determine metrology data (e.g., inspection data, image data, spectroscopy data, ellipsometry data, material compositional, optical, or structural data, etc.) corresponding to substrates produced by the manufacturing equipment 124 (e.g., substrate processing equipment). In some examples, after the manufacturing equipment 124 processes substrates, the metrology equipment 128 is used to inspect portions (e.g., layers) of the substrates. In some embodiments, the metrology equipment 128 performs scanning acoustic microscopy (SAM), ultrasonic inspection, x-ray inspection, and/or computed tomography (CT) inspection. In some examples, after the manufacturing equipment 124 deposits one or more layers on a substrate, the metrology equipment 128 is used to determine quality of the processed substrate (e.g., thicknesses of the layers, uniformity of the layers, interlayer spacing of the layer, and/or the like). In some embodiments, the metrology equipment 128 includes an image capturing device (e.g., SAM equipment, ultrasonic equipment, x-ray equipment, CT equipment, and/or the like). In some embodiments, performance data 152 includes metrology data from metrology equipment 128.

In some embodiments, the data store 140 is memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of sensor data 142, performance data 152, and/or predictive data 160.

Sensor data 142 includes historical sensor data 144 and current sensor data 146. In some embodiments, sensor data 142 may include one or more of image data, interferometer data, capacitance data and or the like. In some embodiments, at least a portion of the sensor data 142 is from sensors 126. Sensor data 142 may include sensor values received from sensors (e.g., local center finder (LCF)) coupled to the processing chamber that detect when an outer diameter and/or inner diameter of a stack of process kit rings pass by the sensors. In some embodiments, the sensor data is associated with centers of upper process kit rings and lower process kit rings. In some embodiments, the sensor data is associated with process kit rings that enter and/or leave the processing chamber. In some embodiments, the sensor data is associated with position corrections of the upper process kit rings and/or lower process kit rings.

Performance data 152 includes historical performance data 154 and current performance data 156. Performance data 152 may include property values of a substrate, an indication of whether property values of a substrate meet threshold values, etc. In some examples, the performance data 152 is indicative of whether a substrate is properly designed, properly produced, and/or properly functioning. In some embodiments, at least a portion of the performance data 152 is associated with a quality of substrates produced by the manufacturing equipment 124. In some embodiments, at least a portion of the performance data 152 is based on metrology data from the metrology equipment 128 (e.g., historical performance data 154 includes metrology data indicating properly processed substrates, property data of substrates, yield, etc.). In some embodiments, at least a portion of the performance data 152 is based on inspection of the substrates (e.g., current performance data 156 based on actual inspection). In some embodiments, the performance data 152 includes an indication of an absolute value (e.g., inspection data of the bond interfaces indicates missing the threshold data by a calculated value, deformation value misses the threshold deformation value by a calculated value) or a relative value (e.g., inspection data of the bond interfaces indicates missing the threshold data by 5%, deformation misses threshold deformation by 5%). In some embodiments, the performance data 152 is indicative of meeting a threshold amount of error (e.g., at least 5% error in production, at least 5% error in flow, at least 5% error in deformation, specification limit).

In some embodiments, the client device 120 provides performance data 152 (e.g., product data). In some examples, the client device 120 provides (e.g., based on user input) performance data 152 that indicates an abnormality in products (e.g., defective products). In some embodiments, the performance data 152 includes an amount of products that have been produced that were normal or abnormal (e.g., 98% normal products). In some embodiments, the performance data 152 indicates an amount of products that are being produced that are predicted as normal or abnormal. In some embodiments, the performance data 152 includes one or more of yield a previous batch of products, average yield, predicted yield, predicted amount of defective or non-defective product, or the like. In some examples, responsive to yield on a first batch of products being 98% (e.g., 98% of the products were normal and 2% were abnormal), the client device 120 provides performance data 152 indicating that the upcoming batch of products is to have a yield of 98%.

In some embodiments, historical data includes one or more of historical sensor data 144 and/or historical performance data 154 (e.g., at least a portion for training the machine learning model 190). Current data includes one or more of current sensor data 146 and/or current performance data 156 (e.g., at least a portion to be input into the trained machine learning model 190 subsequent to training the model 190 using the historical data). In some embodiments, the current data is used for retraining the trained machine learning model 190.

In some embodiments, the predictive data 160 is to be used to cause performance of position corrections of the substrate processing equipment parts (e.g., process kit rings).

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. The data set generator 172 has functions of data gathering, compilation, reduction, and/or partitioning to put the data in a form for machine learning. In some embodiments (e.g., for small datasets), partitioning (e.g., explicit partitioning) for post-training validation is not used. Repeated cross-validation (e.g., 5-fold cross-validation, leave-one-out-cross-validation) may be used during training where a given dataset is in-effect repeatedly partitioned into different training and validation sets during training. A model (e.g., the best model, the model with the highest accuracy, etc.) is chosen from vectors of models over automatically-separated combinatoric subsets. In some embodiments, the data set generator 172 may explicitly partition the historical data (e.g., historical sensor data 144 and corresponding historical performance data 154) into a training set (e.g., sixty percent of the historical data), a validating set (e.g., twenty percent of the historical data), and a testing set (e.g., twenty percent of the historical data). In this embodiment, some operations of data set generator 172 are described in detail below with respect to FIGS. 2 and 7A. In some embodiments, the predictive system 110 (e.g., via predictive component 114) generates multiple sets of features (e.g., training features). In some examples a first set of features corresponds to a first set of types of sensor data (e.g., from a first set of sensors, first combination of values from first set of sensors, first patterns in the values from the first set of sensors) that correspond to each of the data sets (e.g., training set, validation set, and testing set) and a second set of features correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 is capable of training a machine learning model 190 using one or more sets of features associated with the training set from data set generator 172. In some embodiments, the training engine 182 generates multiple trained machine learning models 190, where each trained machine learning model 190 corresponds to a distinct set of parameters of the training set (e.g., sensor data 142) and corresponding responses (e.g., performance data 152). In some embodiments, multiple models are trained on the same parameters with distinct targets for the purpose of modeling multiple effects. In some examples, a first trained machine learning model was trained using sensor data 142 from all sensors 126 (e.g., sensors 1-5), a second trained machine learning model was trained using a first subset of the sensor data (e.g., from sensors 1, 2, and 4), and a third trained machine learning model was trained using a second subset of the sensor data (e.g., from sensors 1, 3, 4, and 5) that partially overlaps the first subset of features.

The validation engine 184 is capable of validating a trained machine learning model 190 using a corresponding set of features of the validation set from data set generator 172. For example, a first trained machine learning model 190 that was trained using a first set of features of the training set is validated using the first set of features of the validation set. The validation engine 184 determines an accuracy of each of the trained machine learning models 190 based on the corresponding sets of features of the validation set. The validation engine 184 evaluates and flags (e.g., to be discarded) trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features of a testing set from data set generator 172. For example, a first trained machine learning model 190 that was trained using a first set of features of the training set is tested using the first set of features of the testing set. The testing engine 186 determines a trained machine learning model 190 that has the highest accuracy of all of the trained machine learning models based on the testing sets.

In some embodiments, the machine learning model 190 (e.g., used for classification) refers to a model artifact that is created by the training engine 182 using a training set that includes data inputs and corresponding target outputs (e.g. correctly classifies a condition or ordinal level for respective training inputs). Patterns in the data sets can be found that map the data input to the target output (the correct classification or level), and the machine learning model 190 is provided mappings that captures these patterns. In some embodiments, the machine learning model 190 uses one or more of Gaussian Process Regression (GPR), Gaussian Process Classification (GPC), Bayesian Neural Networks, Neural Network Gaussian Processes, Deep Belief Network, Gaussian Mixture Model, or other Probabilistic Learning methods. Non probabilistic methods may also be used including one or more of Support Vector Machine (SVM), Radial Basis Function (RBF), clustering, Nearest Neighbor algorithm (k-NN), linear regression, random forest, neural network (e.g., artificial neural network), etc. In some embodiments, the machine learning model 190 is a multivariate analysis (MVA) regression model.

Predictive component 114 provides current sensor data 146 (e.g., as input) to the trained machine learning model 190 and runs the trained machine learning model 190 (e.g., on the input to obtain one or more outputs). The predictive component 114 is capable of determining (e.g., extracting) predictive data 160 from the trained machine learning model 190 and determines (e.g., extracts) uncertainty data that indicates a level of credibility that the predictive data 160 corresponds to current performance data 156. In some embodiments, the predictive component 114 or position correction component 122 use the uncertainty data (e.g., uncertainty function or acquisition function derived from uncertainty function) to decide whether to use the predictive data 160 to perform a position correction or whether to further train the model 190.

Figure 2:
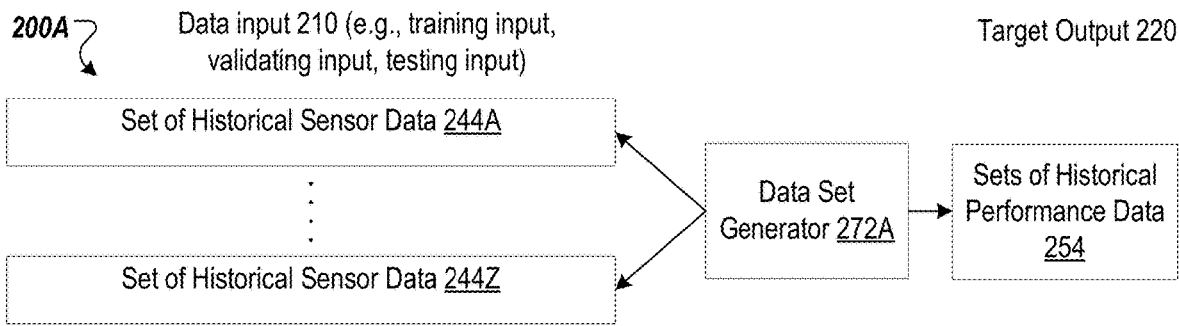
FIG. 2 illustrates a data set generator to create data sets for a machine learning model, according to certain embodiments.

For purpose of illustration, rather than limitation, aspects of the disclosure describe the training of one or more machine learning models 190 using historical data (i.e., prior data, historical sensor data 144 and historical performance data 154) and providing current sensor data 146 into the one or more trained probabilistic machine learning models 190 to determine predictive data 160. In other implementations, a heuristic model or rule-based model is used to determine predictive data 160 (e.g., without using a trained machine learning model). In other implementations non-probabilistic machine learning models may be used. Predictive component 114 monitors historical sensor data 144 and historical performance data 154. In some embodiments, any of the information described with respect to data inputs 210 of FIG. 2 are monitored or otherwise used in the heuristic or rule-based model.

In some embodiments, the functions of client device 120, predictive server 112, server machine 170, and server machine 180 are be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines position corrections based on the predictive data 160. In another example, client device 120 determines the predictive data 160 based on data received from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of determining predictive data 160 for position correction of process kit rings in manufacturing facilities (e.g., substrate processing facilities), in some embodiments, the disclosure can also be generally applied to position correction. Embodiments can be generally applied to determining position correction based on different types of data.

FIG. 2 illustrates a data set generator 272 (e.g., data set generator 172 of FIG. 1) to create data sets for a machine learning model (e.g., model 190 of FIG. 1), according to certain embodiments. In some embodiments, data set generator 272 is part of server machine 170 of FIG. 1. The data sets generated by data set generator 272 of FIG. 2 may be used to train a machine learning model (e.g., see FIG. 7D) to cause position correction (e.g., see FIG. 7E).

Data set generator 272 (e.g., data set generator 172 of FIG. 1) creates data sets for a machine learning model (e.g., model 190 of FIG. 1). Data set generator 272 creates data sets using historical sensor data 244 (e.g., historical sensor data 144 of FIG. 1) and historical performance data 254 (e.g., historical performance data 154 of FIG. 1). System 200 of FIG. 2 illustrates data set generator 272, data inputs 210, and target output 220 (e.g., target data).

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set also includes mapping data that maps the data inputs 210 to the target outputs 220. Data inputs 210 are also referred to as "features," "attributes," or information." In some embodiments, data set generator 272 provides the data set to the training engine 182, validating engine 184, or testing engine 186, where the data set is used to train, validate, or test the machine learning model 190. Some embodiments of generating a training set are further described with respect to FIG. 7A.

In some embodiments, data set generator 272 generates the data input 210 and target output 220. In some embodiments, data inputs 210 include one or more sets of historical sensor data 244. In some embodiments, historical sensor data 244 includes one or more of sensor data from one or more types of sensors, combination of sensor data from one or more types of sensors, patterns from sensor data from one or more types of sensors, dimensions (e.g., center, diameter, etc.) determined based on sensor data, and/or the like.

In some embodiments, data set generator 272 generates a first data input corresponding to a first set of historical sensor data 244A to train, validate, or test a first machine learning model and the data set generator 272 generates a second data input corresponding to a second set of historical sensor data 244B to train, validate, or test a second machine learning model.

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical sensor data 244 to obtain a target output 220 (e.g., discrete historical performance data 254).

Data inputs 210 and target outputs 220 to train, validate, or test a machine learning model include information for a particular facility (e.g., for a particular substrate manufacturing facility). In some examples, historical sensor data 244 and historical performance data 254 are for the same manufacturing facility.

In some embodiments, the information used to train the machine learning model is from specific types of manufacturing equipment 124 of the manufacturing facility having specific characteristics and allow the trained machine learning model to determine outcomes for a specific group of manufacturing equipment 124 based on input for current parameters (e.g., current sensor data 146) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 using the data set, the machine learning model 190 is further trained, validated, or tested (e.g., current performance data 156 of FIG. 1) or adjusted (e.g., adjusting weights associated with input data of the machine learning model 190, such as connection weights in a neural network).

Figure 3:
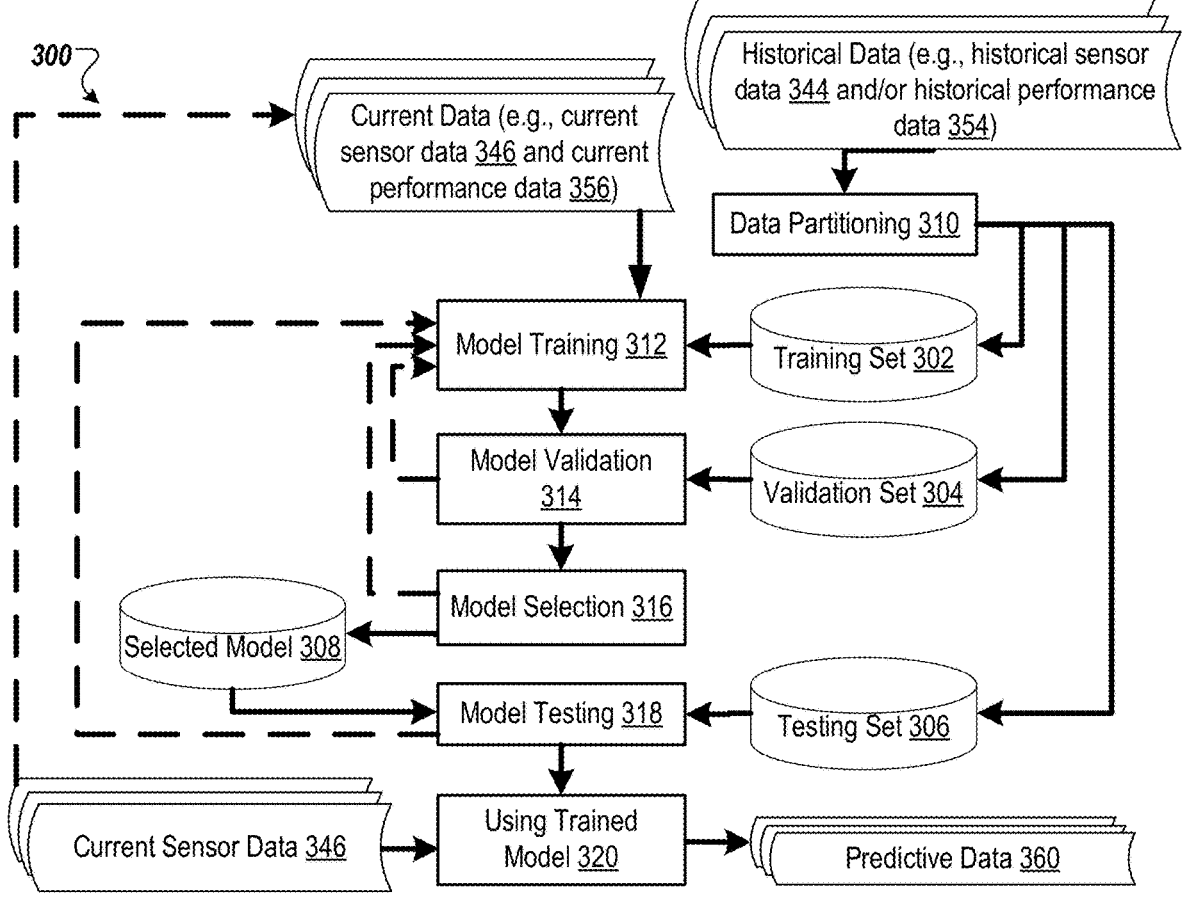
FIG. 3 is a block diagram illustrating determining predictive data, according to certain embodiments.

FIG. 3 is a block diagram illustrating a system 300 for generating predictive data 360 (e.g., predictive data 160 of FIG. 1), according to certain embodiments. The system 300 is used to determine predictive data 360 via a trained machine learning model (e.g., model 190 of FIG. 1) for position correction.

At block 310, the system 300 (e.g., predictive system 110 of FIG. 1) performs data partitioning (e.g., via data set generator 172 of server machine 170 of FIG. 1) of the historical data (e.g., historical sensor data 344 and historical performance data 354 for model 190 of FIG. 1) to generate the training set 302, validation set 304, and testing set 306. In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from 20 sensors (e.g., sensors 126 of FIGS. 1) and 100 products (e.g., products that each correspond to sensor data from the 20 sensors), a first set of features is sensors 1-10, a second set of features is sensors 11-20, the training set is products 1-60, the validation set is products 61-80, and the testing set is products 81-100. In this example, the first set of features of the training set would be parameters from sensors 1-10 for products 1-60.

At block 312, the system 300 performs model training (e.g., via training engine 182 of FIG. 1) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., sensor data from sensors 1-10 for products 1-60) and to generate a second trained machine learning model using the second set of features in the training set (e.g., sensor data from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features used in comparing models overlap (e.g., first set of features being sensor data from sensors 1-15 and second set of features being sensor data from sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models using a corresponding set of features of the validation set 304. For example, system 300 validates the first trained machine learning model using the first set of features in the validation set (e.g., parameters from sensors 1-10 for products 61-80) and the second trained machine learning model using the second set of features in the validation set (e.g., parameters from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., sensor data from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., sensor data from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions.

At block 320, system 300 uses the trained model (e.g., selected model 308) to receive current sensor data 346 (e.g., current sensor data 146 of FIG. 1) and determines (e.g., extracts), from the trained model, predictive data 360 (e.g., predictive data 160 of FIG. 1) to cause position correction. In some embodiments, the current sensor data 346 corresponds to the same types of features in the historical sensor data 344. In some embodiments, the current sensor data 346 corresponds to a same type of features as a subset of the types of features in historical sensor data 344 that is used to train the selected model 308.

In some embodiments, current data is received. In some embodiments, current data includes current performance data 356 (e.g., current performance data 156 of FIG. 1) and/or current sensor data 346. In some embodiments, at least a portion of the current data is received from metrology equipment (e.g., metrology equipment 128 of FIG. 1) or via user input. In some embodiments, the model 308 is retrained based on the current data. In some embodiments, a new model is trained based on the current performance data 356 and the current sensor data 346.

In some embodiments, one or more of the blocks 310-320 occur in various orders and/or with other operations not presented and described herein. In some embodiments, one or more of blocks 310-320 are not be performed. For example, in some embodiments, one or more of data partitioning of block 310, model validation of block 314, model selection of block 316, and/or model testing of block 318 are not be performed.

Figures 4A, 4B, 5A, 5B:
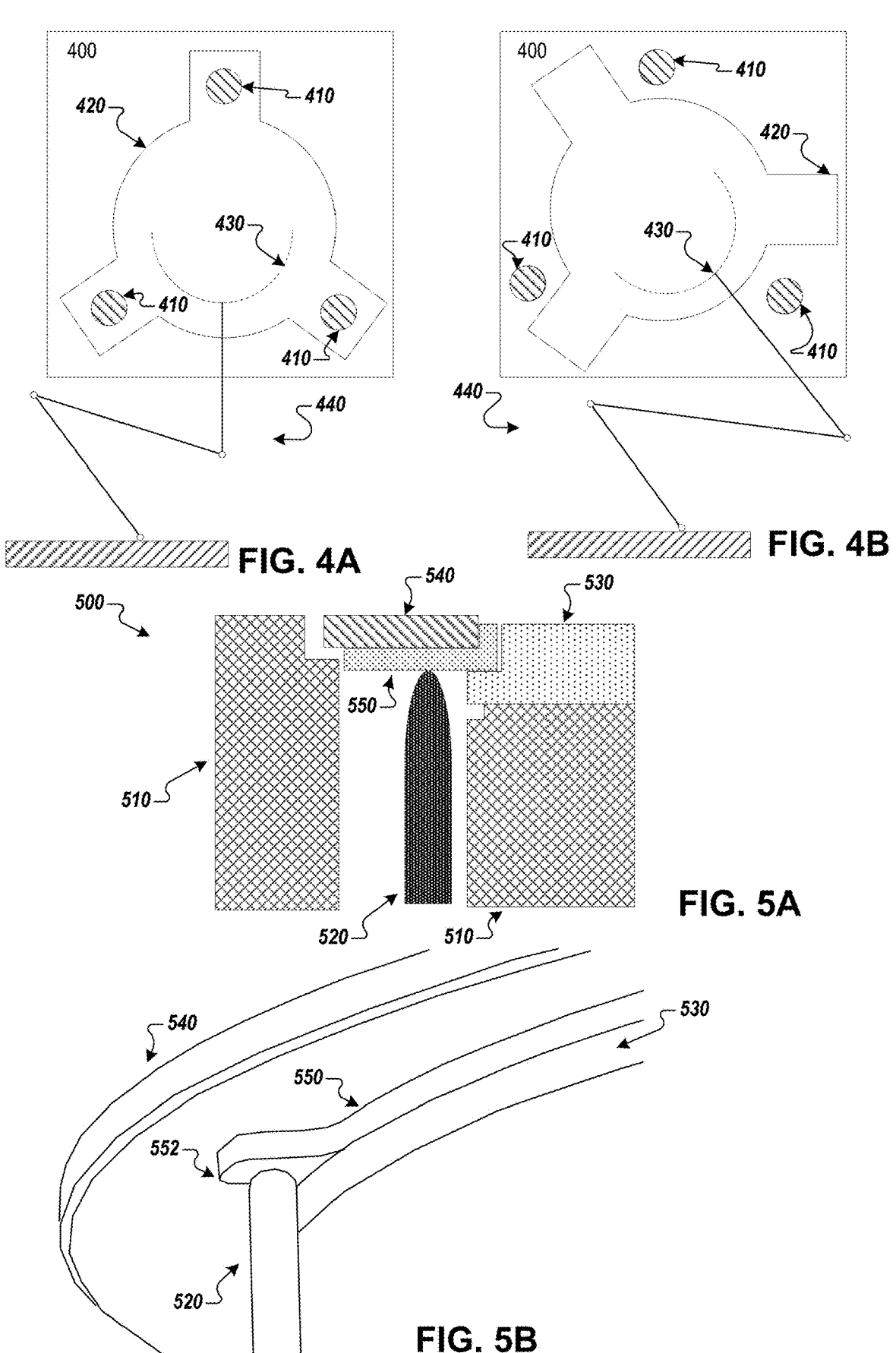
FIGS. 4A-B illustrate position correction of process kit rings, according to certain embodiments.
FIGS. 5A-B illustrate position correction of process kit rings, according to certain embodiments.

FIGS. 4A-B illustrate position correction of process kit rings, according to certain embodiments. FIGS. 4A and 4B illustrate how lower process kit ring 420 (e.g., support ring) can be rotated inside of a processing chamber 400 via a robotic arm 440 with a redundant degree of freedom. The lower process kit ring 420 may be disposed on an end effector 430 of the robotic arm 440 (e.g., a carrier may be disposed between the end effector 430 and the lower process kit ring 420. FIG. 4B illustrates that after the rotation of the lower process kit ring 420, the lift pins 410 may be exposed so that an upper process kit ring (e.g., insert ring, see FIG. 5A) can be elevated independently of the lower process kit ring 420.

Referring to FIG. 4A, a robotic arm 440 (e.g., robot) supporting a stack of process kit rings (e.g., an upper process kit ring disposed on a lower process kit ring) transports the stack of process kit rings into a processing chamber 400. The robotic arm 440 may locate the stack of process kit rings based on a center of the upper process kit ring (e.g., perform position correction of the upper process kit ring). The lower process kit ring may include protrusions that are aligned with lift pins 410.

Referring to FIG. 4B, the robotic arm 440 may rotate the stack of process kit rings while maintaining a center of the upper process kit ring in the same location. The protrusions of the lower process kit ring may no longer be aligned with the lift pins 410. The lift pins may then lift the upper process kit ring from the lower process kit ring and then position of the lower process kit ring may be corrected based on the center of the lower process kit ring to cause the upper and the lower process kit rings to be aligned with each other (e.g., concentric) and aligned with a correct location in the processing chamber 400.

FIGS. 5A-B illustrate position correction of process kit rings, according to certain embodiments. FIGS. 5A and 5B illustrate how the components of a substrate support assembly 500 within a processing chamber may be arranged to allow for independent adjustment of the upper process kit ring 540 (e.g., insert ring) and/or the lower process kit ring 550 (e.g., support ring).

FIG. 5A illustrates a side cross-sectional view of a substrate support assembly 500, according to certain embodiments. One or more lift pins 520 (e.g., chamber process kit lift pin) may be disposed below (e.g., is aligned underneath) both the upper process kit ring 540 and the lower process kit ring 550. The lift pin 520 may be surrounded by components 510 of the substrate support assembly 500. In some embodiments, the substrate support assembly 500 includes an electrostatic chuck 530. The upper process kit ring 540 and the lower process kit ring 550 may be disposed around (e.g., and on a portion of) the electrostatic chuck 530. A substrate (e.g., semiconductor, display, wafer, etc.) is to be disposed on the electrostatic chuck 530 and processed via one or more substrate processing operations. The process kit (e.g., process kit rings 540 and 550) may get worn down over time as a result of the substrate processing operations instead of wearing down other components of the processing chamber (e.g., substrate processing assembly 500). The position correction of process kit rings 540 and/or 550 of the present disclosure (e.g., process kit alignment method) may improve semiconductor yield.

FIG. 5B illustrates a bottom perspective view of a substrate support assembly 500, according to certain embodiments. the lift pin 520 (e.g., process kit lift pin) may be positioned within the substrate support assembly 500 (e.g., in a process chamber) such that the lift pin 520 is disposed under the upper process kit ring 540 and the lower process kit ring 550. The lower process kit ring 550 may include one or more protrusions 554. To be lowered onto the electrostatic chuck 530, the protrusion 554 is to be aligned with the lift pin 552. To remove the upper process kit ring 540 from the lower process kit ring 550, the robot may rotate the stack of process kit rings (e.g., upper process kit ring 540 disposed on the lower process kit ring 550) so that the protrusion 554 is not disposed above the lift pin 552 (e.g., giving the lift pin 552 access to the upper process kit ring 540).

FIGS. 6A-D illustrate position correction of process kit rings, according to certain embodiments. FIGS. 6A-D illustrate the process of removing the upper process kit ring 610 (e.g., insert ring) via the structure 630 (e.g., surface, shelf, insert ring support fingers, etc.) from the lower process kit ring 620 (e.g., support ring) (e.g., by lowering the lower process kit ring 620), adjusting the position of the lower process kit ring 620 (e.g., disposed on carrier 640) via robot end effector 650, and disposing the upper process kit ring 610 on the lower process kit ring 620 (e.g., by lifting the lower process kit ring 620).

Figure 6A:
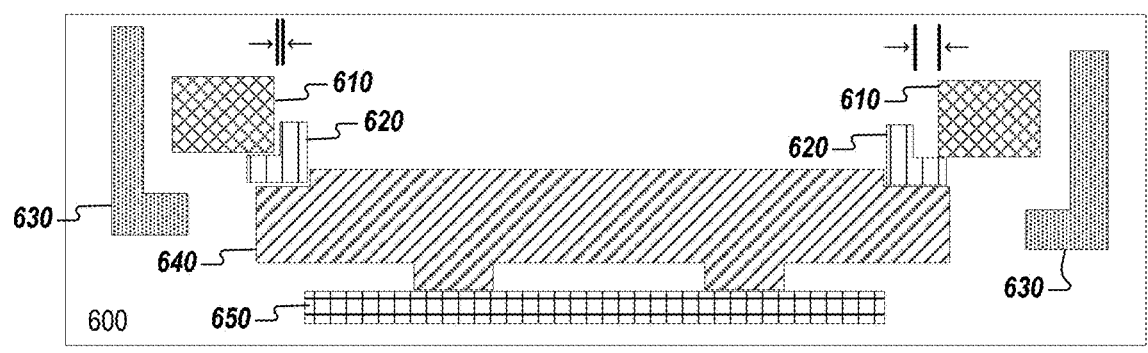
FIGS. 6A-D illustrate position correction of process kit rings, according to certain embodiments.

Referring to FIG. 6A, an upper process kit ring 610 is disposed on a lower process kit ring 620 that is further disposed on a carrier 640. The carrier is disposed on a robot end effector 650. FIG. 6A shows that the upper process kit ring 610 and the lower process kit ring 620 are not concentric (e.g., left gap between the upper process kit ring 610 and the lower process kit ring 620 is not the same as the right gap between the upper process kit ring 610 and the lower process kit ring 620). The structure 630 (e.g., insert ring support fingers) are positioned below the upper process kit ring 610 (e.g., without touching the upper process kit ring 610).

Figure 6B:
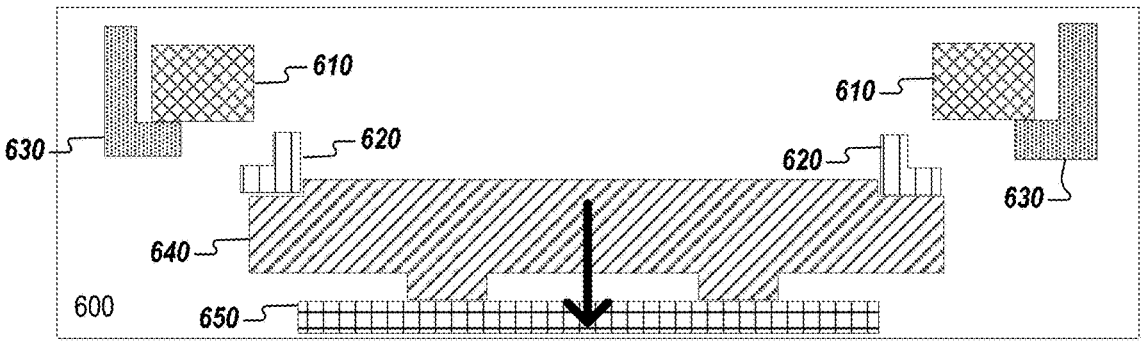

Referring to FIG. 6B, the robot end effector 650 moves the carrier 640 down which leaves the upper process kit ring 610 on the stationary structure 630 (e.g., insert ring support fingers). The lower process kit ring 620 remains disposed on the carrier 640 (e.g., lower process kit ring maintains original orientation).

Figure 6C:
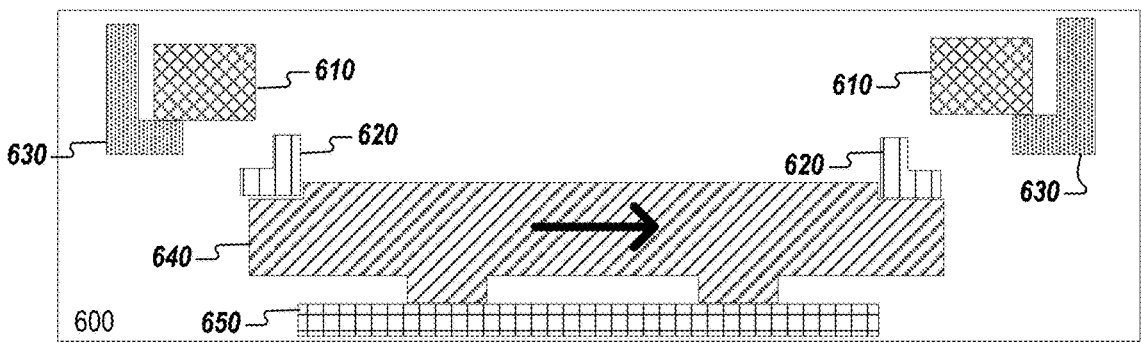

Referring to FIG. 6C, robot end effector 650 moves the carrier 640 supporting lower process kit ring 620 in the X-direction and/or the Y-direction within the processing chamber 600 to correct the position of the lower process kit ring 620 relative to the upper process kit ring 610 (e.g., to correct support ring and insert ring misalignment, to cause concentricity).

Figure 6D:
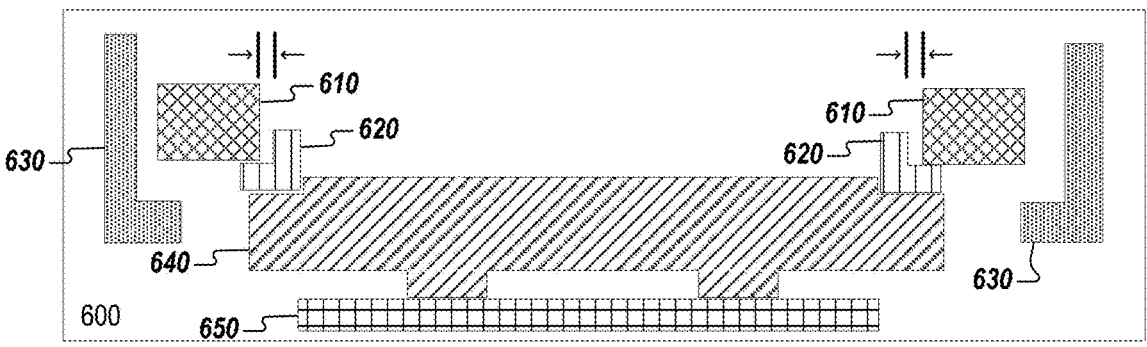

Referring to FIG. 6D, the robot end effector 650 moves the carrier 640 up to cause the lower process kit ring 620 to lift the upper process kit ring 610 off of the structure 630. FIG. 6D shows that the gap between the upper process kit ring 610 and the lower process kit ring 620 on the left and right sides are now substantially equal (e.g., causing the upper process kit ring 610 and the lower process kit ring 620 to be substantially concentric).

FIGS. 7A-E are flow diagrams of methods 700A-E associated with position correction of process kit rings (e.g., process kit ring alignment, process kit alignment method for improving semiconductor yield), according to certain embodiments. In some embodiments, methods 700A-E are performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 700A-E are performed, at least in part, by predictive system 110 and/or client device 120. In some embodiments, method 700A is performed, at least in part, by predictive system 110 (e.g., server machine 170 and data set generator 172 of FIG. 1, data set generator 272 of FIG. 2). In some embodiments, predictive system 110 uses method 700A to generate a data set to at least one of train, validate, or test a machine learning model. In some embodiments, methods 700B-C are performed by client device 120. In some embodiments, method 700D is performed by server machine 180 (e.g., training engine 182, etc.). In some embodiments, method 700E is performed by predictive server 112 (e.g., predictive component 114). In some embodiments, method 700C is performed by client device 120 (e.g., position correction component 122). In some embodiments, a non-transitory storage medium stores instructions that when executed by a processing device (e.g., of predictive system 110, of server machine 180, of predictive server 112, etc.), cause the processing device to perform one or more of methods 700A-E.

For simplicity of explanation, methods 700A-E are depicted and described as a series of operations. However, operations in accordance with this disclosure can occur in various orders and/or concurrently and with other operations not presented and described herein. Furthermore, in some embodiments, not all illustrated operations are performed to implement methods 700A-E in accordance with the disclosed subject matter. In addition, those skilled in the art will understand and appreciate that methods 700A-E could alternatively be represented as a series of interrelated states via a state diagram or events.

Figure 7A:
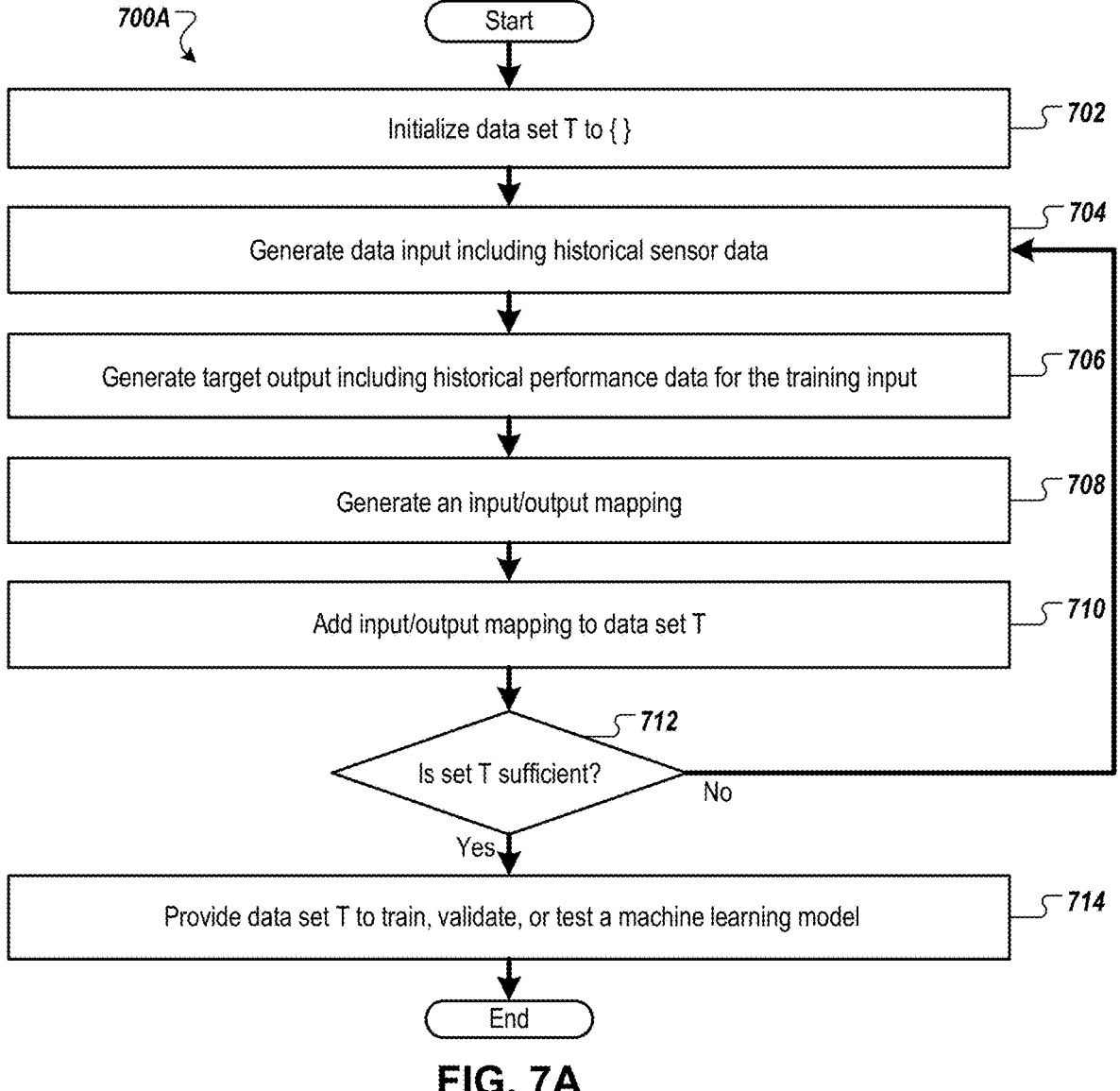
FIGS. 7A-E are flow diagrams of methods associated with position correction of process kit rings, according to certain embodiments.

FIG. 7A is a flow diagram of a method 700A for generating a data set for a machine learning model for generating predictive data (e.g., predictive data 160 of FIG. 1), according to certain embodiments.

Referring to FIG. 7A, in some embodiments, at block 702 the processing logic implementing method 700A initializes a training set T to an empty set.

At block 704, processing logic generates first data input (e.g., first training input, first validating input) that includes sensor data (e.g., historical sensor data 144 of FIG. 1, historical sensor data 244 of FIG. 2, etc.). In some embodiments, the first data input includes a first set of features for types of sensor data and a second data input includes a second set of features for types of sensor data (e.g., as described with respect to FIG. 2). The sensor data may be associated with sensor values received from sensors coupled to the processing chamber that detect when an outer diameter and/or inner diameter of a stack of process kit rings pass by the sensors. In some embodiments, the sensor data is associated with centers of upper process kit rings and lower process kit rings. In some embodiments, the sensor data is associated with process kit rings that enter and/or leave the processing chamber. In some embodiments, the sensor data is associated with position corrections of the upper process kit rings and/or lower process kit rings.

At block 706, processing logic generates a first target output for one or more of the data inputs (e.g., first data input). In some embodiments, the first target output is historical performance data (e.g., historical performance data 154 of FIG. 1, historical performance data 254 of FIG. 2). In some embodiments, the historical performance data is associated with substrate quality (e.g., whether property data of the substrates meet target property data).

At block 708, processing logic optionally generates mapping data that is indicative of an input/output mapping. The input/output mapping (or mapping data) refers to the data input (e.g., one or more of the data inputs described herein), the target output for the data input (e.g., where the target output identifies historical performance data 154), and an association between the data input(s) and the target output.

At block 710, processing logic adds the mapping data generated at block 708 to data set T.

At block 712, processing logic branches based on whether data set T is sufficient for at least one of training, validating, and/or testing machine learning model 190 (e.g., uncertainty of the trained machine learning model meets a threshold uncertainty). If so, execution proceeds to block 714, otherwise, execution continues back to block 704. It should be noted that in some embodiments, the sufficiency of data set T is determined based simply on the number of input/output mappings in the data set, while in some other implementations, the sufficiency of data set T is determined based on one or more other criteria (e.g., a measure of diversity of the data examples, accuracy, etc.) in addition to, or instead of, the number of input/output mappings.

At block 714, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T.

After block 714, machine learning model (e.g., machine learning model 190) can be at least one of trained using training engine 182 of server machine 180, validated using validating engine 184 of server machine 180, or tested using testing engine 186 of server machine 180. The trained machine learning model is implemented by predictive component 114 (of predictive server 112) to generate predictive data (e.g., predictive data 160) for position correction to cause performance of a position correction.

Figure 7B:
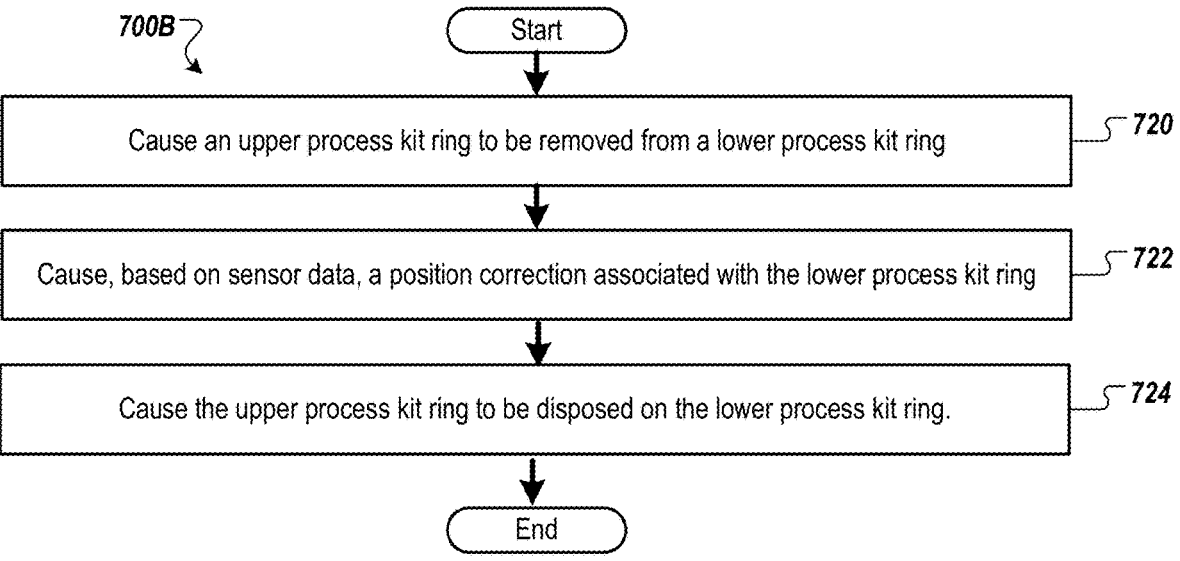

FIG. 7B is a method 700B associated with position correction of a process kit ring, according to certain embodiments. Via method 700B, processing logic may dynamically correct position of process kit rings.

At block 720 of method 700B, the processing logic causes an upper process kit ring to be removed from a lower process kit ring. In some embodiments, block 720 is by causing lift pins to lift the upper process kit ring from the lower process kit ring (e.g., see FIGS. 4A-5B). In some embodiments, block 720 is by lowering the upper process kit ring (e.g., that is disposed on the lower process kit ring) onto a structure (e.g., surface, shelf, fingers, etc.) to cause the upper process kit ring to be disposed on the structure while allowing the lower process kit ring to be moved independent from the upper process kit ring (e.g., see FIGS. 6A-D).

At block 722, the processing logic causes, based on sensor data, a position correction associated with the lower process kit ring. In some embodiments, the sensor data is associated with an inside diameter of the lower process kit ring and/or a center of the lower process kit ring. The processing device may determine a position correction to align the lower process kit ring (e.g., the center of the lower process kit ring) with the upper process kit ring (e.g., to be concentric, to have substantially equal gap between the process kit rings). The processing device may determine a position correction to have a predetermined positioning of the lower process kit ring relative to the upper process kit ring (e.g., concentric, offset, etc.).

At block 724, the processing logic causes the upper process kit ring to be disposed on the lower process kit ring. In some embodiments, block 724 is by lowering the upper process kit ring by lowering the lift pins. In some embodiments, block 724 is by raising the lower process kit ring to lift the upper process kit ring off of the structure (e.g., shelf, fingers, etc.).

Figure 7C:
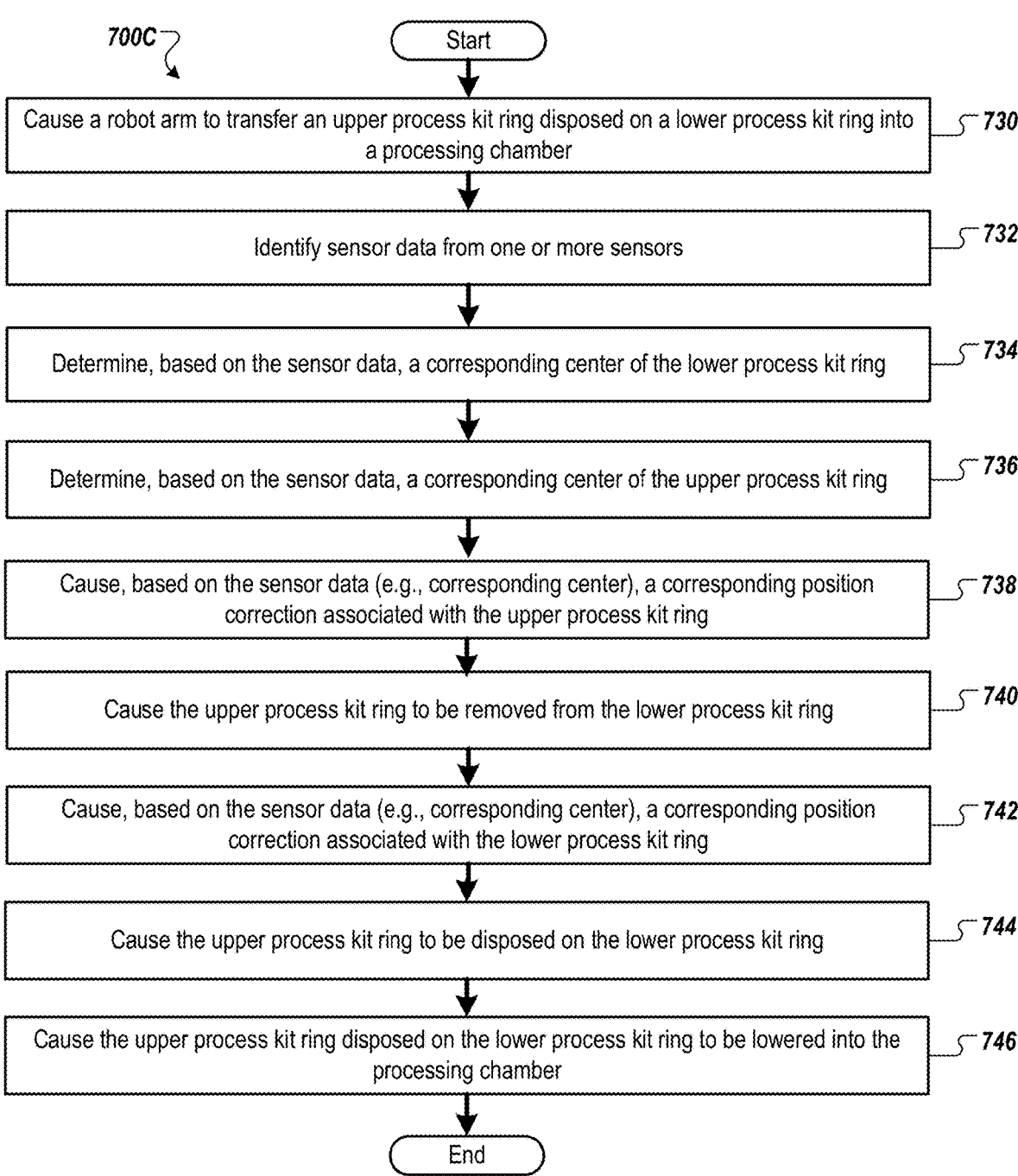

FIG. 7C is a method associated with position correction of one or more process kit rings, according to certain embodiments.

At block 730, the processing logic causes a robot arm to transfer an upper process kit ring disposed on a lower process kit ring into a processing chamber of a substrate processing system. The lower process kit ring may be disposed on a carrier that is disposed on the robot arm (e.g., end effector of the robot arm).

At block 732, the processing logic identifies sensor data from one or more sensors (e.g., associated with the processing chamber, of the local center finder (LCF)). The sensor data may include first sensor values associated with an inside diameter of the lower process kit ring and second sensor values associated with an outside diameter of the upper process kit ring. In some embodiments, the one or more sensors may be separate from the processing chamber (e.g., associated with a load lock, associated with an aligner, associated with an LCF separate from the processing chamber, etc.).

At block 734, the processing logic determines, based on the sensor data (e.g., the first sensor values associated with the inside diameter of the lower process kit ring), a first center of the lower process kit ring.

At block 736, the processing logic determines, based on the sensor data (e.g., the second sensor values associated with the outer diameter of the upper process kit ring), a second center of the upper process kit ring.

At block 738, the processing device causes, based on the sensor data (e.g., the second center), a second position correction (e.g., in the x-direction and/or y-direction) associated with the upper process kit ring (e.g., to align the insert ring with the chamber taught center position). Block 736 may be via causing a robot to transfer the stack of process kit rings to position the upper process kit ring in the correct position (e.g., the lower process kit ring may be offset).

At block 740, the processing logic causes the upper process kit ring to be removed from the lower process kit ring.

In some embodiments, at block 740, the processing logic rotates the upper process kit ring disposed on the lower process kit ring to cause protrusions of the lower process kit ring to not be above lift pins. The processing logic may use a redundant degree of freedom of the robot arm to rotate the carrier and process kit rings without changing the X and Y position of the process kit rings.

In some embodiments, at block 740, the processing logic further causes the lift pins (e.g., chamber process kit lift pins) to remove the upper process kit ring from the lower process kit ring (e.g., upper process kit ring is disposed on the lift rings and the lower process kit ring is disposed on the carrier that is disposed on the robot arm).

In some embodiments, instead of using lift pins, at block 740, the processing logic may cause the robot arm to lower the stack of process kit rings so that the upper process kit ring is disposed on a structure (e.g., shelf, fingers) and the lower process kit ring is further lowered independent from the upper process kit ring.

At block 742, the processing logic causes, based on the sensor data (e.g., first center of the lower process kit ring), first position correction (e.g., in the x-direction and/or y-direction) associated with the lower process kit ring.

At block 744, the processing logic causes the upper process kit ring to be disposed on the lower process kit ring.

In some embodiments, at block 744, the processing logic causes the lift pins (e.g., chamber process kit lift pins) to move down to place the upper process kit ring on the lower process kit ring that is disposed on the carrier.

In some embodiments, at block 744, the processing logic further uses the redundant degree of freedom of the robot arm to rotate the carrier supporting the stack of process kit rings back to the original angle.

In some embodiments, at block 744, the processing logic causes the lower process kit ring to be raised to lift the upper process kit ring off of a structure (e.g., shelf, fingers, etc.).

At block 746, the processing logic causes the upper process kit ring disposed on the lower process kit ring to be lowered into the processing chamber.

Figure 7D:
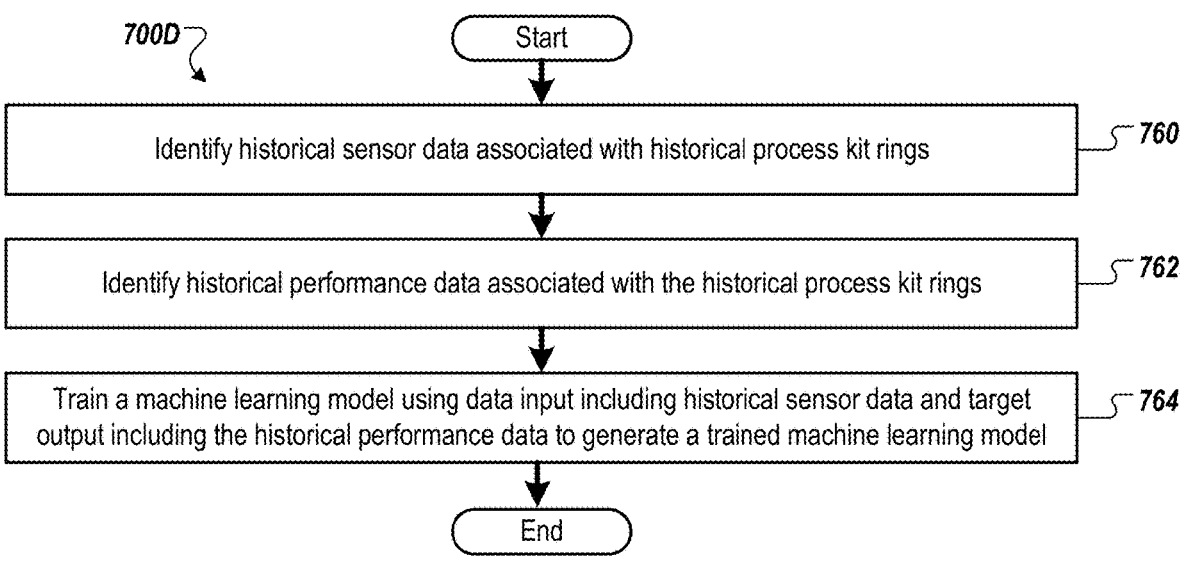

FIG. 7D is a method for training a machine learning model (e.g., model 190 of FIG. 1) for determining predictive data (e.g., predictive data 160 of FIG. 1) for position correction via image analytics.

Referring to FIG. 7D, at block 760 of method 700D, the processing logic identifies historical sensor data (e.g., historical sensor data 144 of FIG. 1, historical input sensor data) associated with historical process kit rings. The historical sensor data may be associated with historical sensor values received from sensors (e.g., LCF) coupled to the processing chamber that detect when an outer diameter and/or inner diameter of a stack of process kit rings pass by the sensors. In some embodiments, the historical sensor data is associated with centers of upper process kit rings and lower process kit rings. In some embodiments, the historical sensor data is associated with process kit rings that enter and/or leave the processing chamber. In some embodiments, the historical sensor data is associated with historical position corrections of the upper process kit rings and/or lower process kit rings.

In some embodiments, the historical sensor data includes historical sensor data associated with historical outside diameters of historical upper process kit rings and historical inside diameters of a historical lower process kit rings.

At block 762, the processing logic identifies historical performance data (e.g., historical performance data 154 of FIG. 1, historical output performance data). The historical performance data may be an indication of whether performance data (e.g., property values, amount of defects, etc.) of substrates produced using the historical process kit rings meet threshold values (e.g., good wafers or bad wafers). In some embodiments, the historical performance data is associated with substrate quality (e.g., whether property data of the substrates meet target property data).

In some embodiments, the historical sensor data is associated with substrates processed using one or more of the historical upper process kit rings and historical lower process kit rings.

At block 764, the processing logic trains a machine learning model using data input including historical sensor data and target output including the historical performance data to generate a trained machine learning model.

Figure 7E:
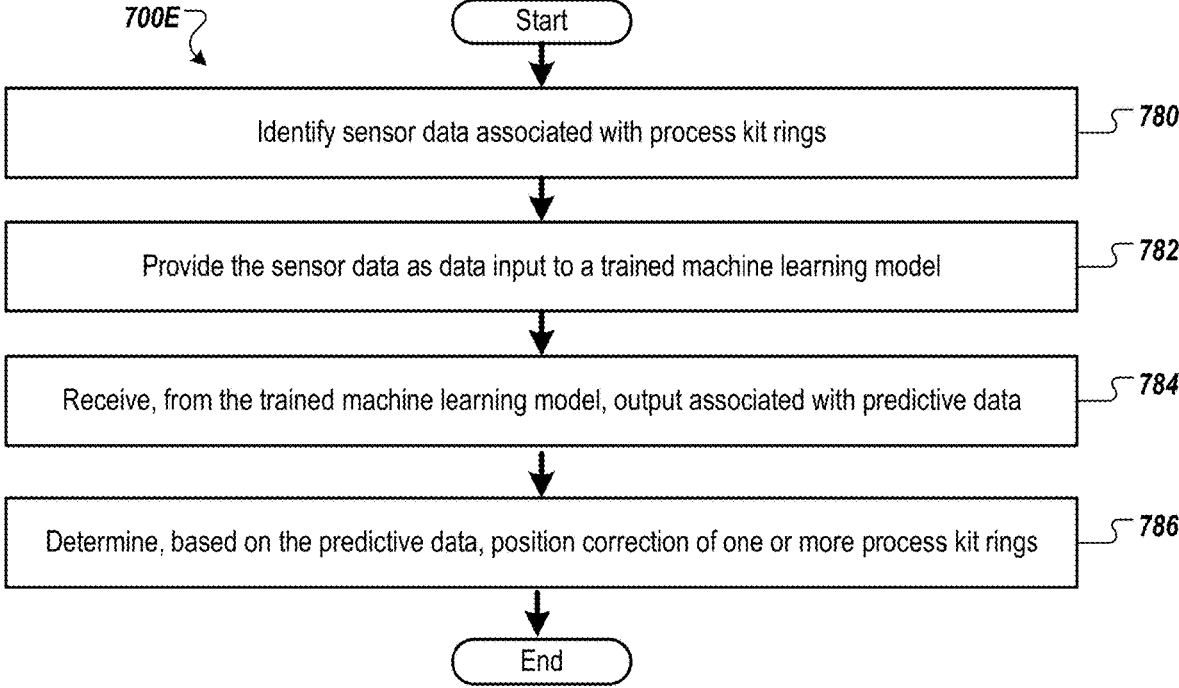

FIG. 7E is a method 700E for using a trained machine learning model (e.g., model 190 of FIG. 1) for position correction of process kit rings.

Referring to FIG. 7E, at block 780 of method 700E, the processing logic identifies sensor data. In some embodiments, the sensor data of block 780 includes sensor values received from sensors (e.g., LCF) coupled to the processing chamber that detect when an outer diameter and/or inner diameter of a stack of process kit rings pass by the sensors. In some embodiments, the sensor data is associated with centers of upper process kit rings and lower process kit rings. In some embodiments, the sensor data is associated with process kit rings that has entered the processing chamber. In some embodiments, the sensor data is associated with positions (e.g., prior to or after a position correction) of the process kit rings. In some embodiments, the sensor data is associated with position correction of one or more process kit rings. Sensor data of block 780 of FIG. 7E may be similar to sensor data of block 722 of FIG. 7B.

At block 782, the processing logic provides the sensor data as data input to a trained machine learning model (e.g., trained via block 764 of FIG. 7D).

At block 784, the processing logic receives, from the trained machine learning model, output associated with predictive data.

At block 786, the processing logic determines, based on the predictive data, position correction of one or more of the process kit rings. In some embodiments, the predictive data is predictive performance data of substrates to be processed using the positions of the process kit rings. Responsive to the predictive performance data meeting threshold performance data values, the processing logic is not to cause position correction of the process kit rings. Responsive to the predictive performance data not meeting threshold performance data values, the processing logic is to determine position corrections of the process kit rings to cause the performance data to meet threshold performance data values.

Figure 8:
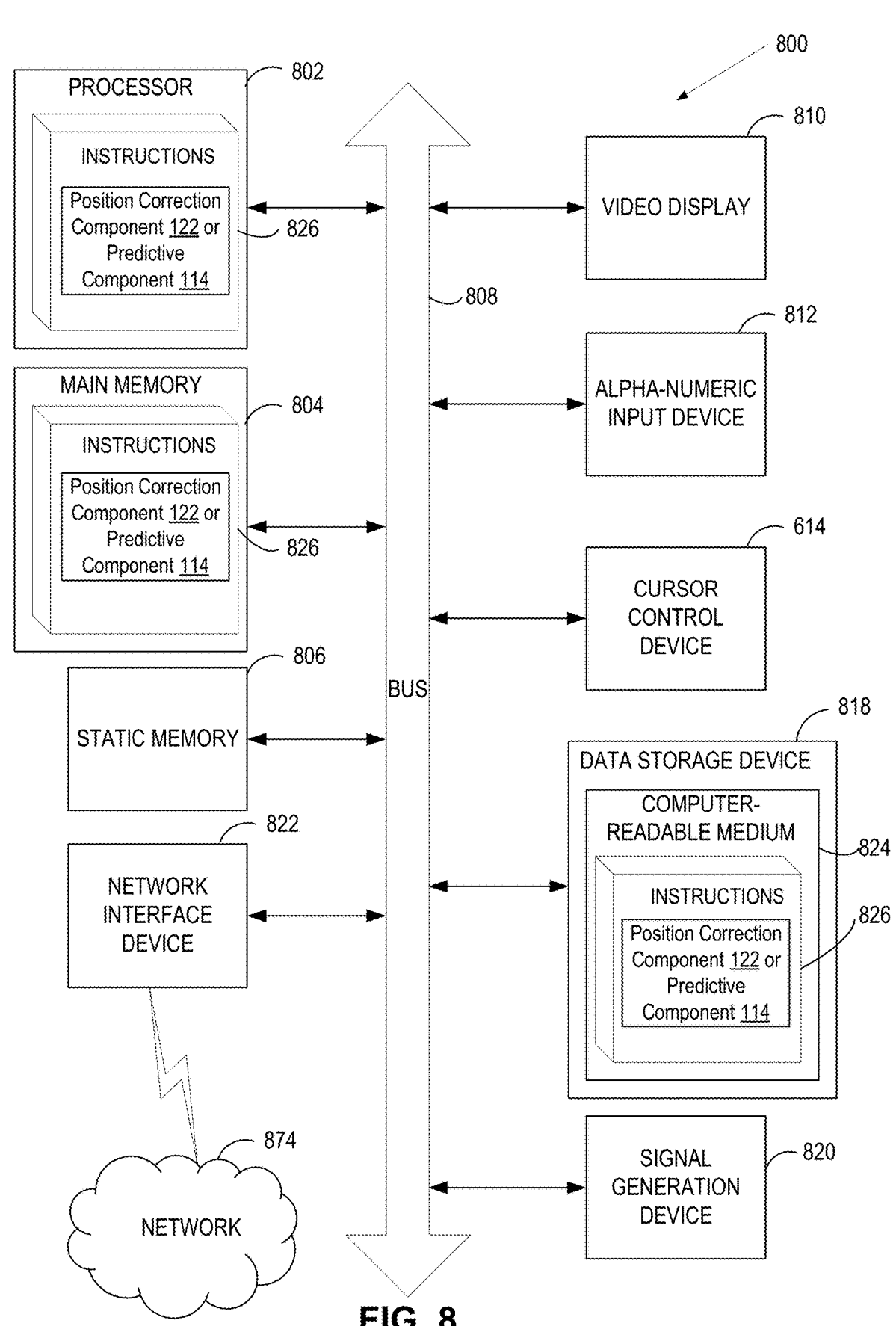
FIG. 8 is a block diagram illustrating a computer system, according to certain embodiments.

FIG. 8 is a block diagram illustrating a computer system 800, according to certain embodiments. In some embodiments, the computer system 800 is one or more of client device 120, predictive system 110, server machine 170, server machine 180, or predictive server 112.

In some embodiments, computer system 800 is connected (e.g., via a network, such as a Local Area Network (LAN), an intranet, an extranet, or the Internet) to other computer systems. In some embodiments, computer system 800 operates in the capacity of a server or a client computer in a client-server environment, or as a peer computer in a peer-to-peer or distributed network environment. In some embodiments, computer system 800 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 includes a processing device 802, a volatile memory 804 (e.g., Random Access Memory (RAM)), a non-volatile memory 806 (e.g., Read-Only Memory (ROM) or Electrically-Erasable Programmable ROM (EEPROM)), and a data storage device 816, which communicate with each other via a bus 808.

In some embodiments, processing device 802 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 800 further includes a network interface device 822 (e.g., coupled to network 874). In some embodiments, computer system 800 also includes a video display unit 810 (e.g., an LCD), an alphanumeric input device 812 (e.g., a keyboard), a cursor control device 814 (e.g., a mouse), and a signal generation device 820.

In some implementations, data storage device 816 includes a non-transitory computer-readable storage medium 824 on which store instructions 826 encoding any one or more of the methods or functions described herein, including instructions encoding components of FIG. 1 (e.g., position correction component 122, predictive component 114, etc.) and for implementing methods described herein (e.g., one or more of methods 700A-E).

In some embodiments, instructions 826 also reside, completely or partially, within volatile memory 804 and/or within processing device 802 during execution thereof by computer system 800, hence, in some embodiments, volatile memory 804 and processing device 802 also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICs, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "causing," "removing," "correcting," "disposing," "identifying," "transferring," "determining," "moving," "lowering," "rotating," "providing," "receiving," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

The invention claimed is:

1. A method comprising:
causing an upper process kit ring to be removed from a lower process kit ring;
responsive to the causing of the upper process kit ring to be removed from the lower process kit ring, causing, based on sensor data, a first position correction associated with the lower process kit ring; and
responsive to the first position correction, causing the upper process kit ring to be disposed on the lower process kit ring.

2. The method of claim 1 further comprising, responsive to the causing of the upper process kit ring to be disposed on the lower process kit ring, causing the upper process kit ring disposed on the lower process kit ring is to be lowered into a processing chamber of a substrate processing system.

3. The method of claim 2 further comprising causing a robot arm to rotate the upper process kit ring disposed on the lower process kit ring to align the lower process kit ring with lift pins, wherein the causing of the upper process kit ring disposed on the lower process kit ring to be lowered into the processing chamber is via the lift pins.

4. The method of claim 1 further comprising causing, based on the sensor data, a second position correction associated with the upper process kit ring.

5. The method of claim 4, the sensor data comprising first sensor values and second sensor values, the method further comprising identifying the first sensor values associated with an inside diameter of the lower process kit ring and the second sensor values associated with an outside diameter of the upper process kit ring.

6. The method of claim 5 further comprising causing a robot arm to transfer the upper process kit ring disposed on the lower process kit ring into a processing chamber, wherein the first sensor values and the second sensor values are identified via two or more sensors associated with the processing chamber.

7. The method of claim 5 further comprising:
determining, based on the first sensor values, a first center of the lower process kit ring, wherein the causing of the first position correction is based on the first center of the lower process kit ring; and
determining, based on the second sensor values, a second center of the upper process kit ring, wherein the causing of the second position correction is based on the second center of the upper process kit ring.

8. The method of claim 5, wherein the causing of the first position correction and the causing of the second position correction comprises:
providing the first sensor values and the second sensor values as input to a trained machine learning model;
receiving, from the trained machine learning model, output associated with predictive data; and
determining, based on the predictive data, the first position correction and the second position correction.

9. The method of claim 8, wherein the trained machine learning model is trained based on data input comprising historical sensor data associated with historical outside diameters of historical upper process kit rings and historical inside diameters of a historical lower process kit rings and target output comprising historical performance data associated with substrates processed using one or more of the historical upper process kit rings and historical lower process kit rings.

10. The method of claim 4, wherein the causing of the second position correction associated with the upper process kit ring is via moving of the upper process kit ring disposed on the lower process kit ring via a robot arm.

11. The method of claim 1, wherein the causing of the upper process kit ring to be removed from the lower process kit ring comprises causing lift pins of a processing chamber to lift the upper process kit ring off of the lower process kit ring.

12. The method of claim 1, wherein the causing of the upper process kit ring to be disposed on the lower process kit ring is via lowering a robot arm.

13. The method of claim 1, wherein the causing of the upper process kit ring to be removed from the lower process kit ring comprises causing a robot arm to dispose the upper process kit ring on a surface to remove the upper process kit ring from the lower process kit ring.

14. A non-transitory computer-readable storage medium storing instructions which, when executed, cause a processing device to perform operations comprising:
causing an upper process kit ring to be removed from a lower process kit ring;
responsive to the causing of the upper process kit ring to be removed from the lower process kit ring, causing, based on sensor data, a first position correction associated with the lower process kit ring; and
responsive to the first position correction, causing the upper process kit ring to be disposed on the lower process kit ring.

15. The non-transitory computer-readable storage medium of claim 14, wherein the sensor data comprising first sensor values and second sensor values, the storage medium further comprises identifying the first sensor values associated with an inside diameter of the lower process kit ring and the second sensor values associated with an outside diameter of the upper process kit ring.

16. The non-transitory computer-readable storage medium of claim 15, the operations further comprising:
determining, based on the first sensor values, a first center of the upper process kit ring, wherein the causing of the first position correction is based on the first center of the upper process kit ring; and
determining, based on the second sensor values, a second center of the lower process kit ring, wherein the causing of a second position correction is based on the second center of the lower process kit ring.

17. A system comprising:
a memory; and
a processing device coupled to the memory, the processing device to:
cause an upper process kit ring to be removed from a lower process kit ring;
responsive to causing the upper process kit ring to be removed from the lower process kit ring, cause, based on sensor data, a first position correction associated with the lower process kit ring; and
responsive to the first position correction, cause the upper process kit ring to be disposed on the lower process kit ring.

18. The system of claim 17, wherein the sensor data comprising first sensor values and second sensor values, wherein the processing device is further to identify the first sensor values associated with an inside diameter of the lower process kit ring and the second sensor values associated with an outside diameter of the upper process kit ring.

19. The system of claim 18, wherein the processing device is further to:
determine, based on the first sensor values, a first center of the upper process kit ring, wherein causing of the first position correction is based on the first center of the upper process kit ring; and
determine, based on the second sensor values, a second center of the lower process kit ring, wherein causing of a second position correction is based on the second center of the lower process kit ring.

20. The system of claim 19, wherein the processing device is further to:
providing the first sensor values and the second sensor values as input to a trained machine learning model;
receiving, from the trained machine learning model, output associated with predictive data; and determining, based on the predictive data, the first position correction and the second position correction.

* * * * *